United States Patent
Landru (10) Patent No.: US 12,490,656 B2
(45) Date of Patent: Dec. 2, 2025

(54) HYBRID STRUCTURE AND A METHOD FOR MANUFACTURING THE SAME

(71) Applicant: Soitec, Bernin (FR)

(72) Inventor: Didier Landru, Le Champ-près-Froges (FR)

(73) Assignee: Soitec, Bernin (FR)

( * ) Notice: Subject to any disclaimer, the term of this patent is extended or adjusted under 35 U.S.C. 154(b) by 59 days.

(21) Appl. No.: 18/403,485

(22) Filed: Jan. 3, 2024

(65) Prior Publication Data

US 2024/0147864 A1    May 2, 2024

Related U.S. Application Data (63) Continuation of application No. 17/663,569, filed on May 16, 2022, now Pat. No. 11,930,710, which is a (Continued)

(30) Foreign Application Priority Data

Oct. 20, 2015  (FR) ...................... 1559993

(51) Int. Cl.
*H10N 30/073*  (2023.01)
*H03H 9/02*  (2006.01)
(Continued)

(52) U.S. Cl.
CPC ...... *H10N 30/073* (2023.02); *H03H 9/02574* (2013.01); *H10N 30/508* (2023.02); *H10N 30/706* (2024.05); *H10N 30/88* (2023.02)

(58) Field of Classification Search
CPC .. H10N 30/073; H10N 30/508; H10N 30/706; H10N 30/88; H10N 30/072; H10N 30/01; H03H 9/02574
See application file for complete search history.

(56) References Cited

U.S. PATENT DOCUMENTS

| | | | |
|---|---|---|---|
| 5,759,753 A | 6/1998 | Namba et al. | |
| 8,481,409 B2 * | 7/2013 | Moriceau | H01L 21/76256 438/459 |

(Continued)

FOREIGN PATENT DOCUMENTS

| | | |
|---|---|---|
| CN | 1505263 A | 6/2004 |
| JP | 05-327383 A | 12/1993 |

(Continued)

OTHER PUBLICATIONS

Yamashita et.al., Buckling Behavior of Piezoelectric Diaphragms for Highly Sensitive Structures of Ultrasonic Microsensors Controlled through Intrinsic Stress of PZT Films, IEEE Int Symp, Jul. 2015 (Year: 2015).*

(Continued)

*Primary Examiner* — Jeffrey T Carley
*Assistant Examiner* — Jose K Abraham
(74) *Attorney, Agent, or Firm* — TraskBritt (57) ABSTRACT

A hybrid structure includes a support substrate having a first coefficient of thermal expansion and a support thickness, and an effective layer disposed on and molecularly bonded to the support substrate along a bonding interface having a bonding energy greater than or equal to 1000 mJ/m². The effective layer has an effective thickness and a second coefficient of thermal expansion greater than the first coefficient of thermal expansion of the support substrate. One or more non-bonded areas are present at the bonding interface between the effective layer and the support substrate. The effective thickness is less than a threshold thickness at which buckling of the effective layer occurs upon annealing of the hybrid structure at a temperature of 400° C.±200° C.

15 Claims, 3 Drawing Sheets

Related U.S. Application Data continuation of application No. 15/769,690, filed as application No. PCT/FR2016/052674 on Oct. 17, 2016, now Pat. No. 11,349,065.

(51) Int. Cl.
| | |
|---|---|
| *H10N 30/00* | (2023.01) |
| *H10N 30/50* | (2023.01) |
| *H10N 30/88* | (2023.01) |

(56) References Cited

U.S. PATENT DOCUMENTS

| | | | |
|---|---|---|---|
| 8,866,365 B2 | 10/2014 | Hori et al. | |
| 9,680,083 B2 | 6/2017 | Hori et al. | |
| 11,349,065 B2 | 5/2022 | Landru | |
| 2002/0158947 A1 | 10/2002 | Kanno et al. | |
| 2004/0135650 A1 | 7/2004 | Miura et al. | |
| 2005/0026391 A1* | 2/2005 | Ghyselen | H01L 21/76254 |
| | | | 438/455 |
| 2008/0203137 A1 | 8/2008 | La et al. | |
| 2009/0261064 A1* | 10/2009 | Kerdiles | H01L 21/76251 |
| | | | 156/308.2 |
| 2011/0259422 A1* | 10/2011 | Finot | F24S 23/77 |
| | | | 136/259 |
| 2012/0015497 A1* | 1/2012 | Gaudin | H01L 21/187 |
| | | | 438/455 |
| 2012/0138238 A1* | 6/2012 | Tauzin | H01L 21/76254 |
| | | | 156/711 |
| 2012/0258554 A1 | 10/2012 | Belle | |
| 2013/0323861 A1* | 12/2013 | Lagahe | H01L 22/12 |
| | | | 438/14 |
| 2014/0145558 A1* | 5/2014 | Hori | H10N 30/072 |
| | | | 310/313 R |
| 2014/0210317 A1 | 7/2014 | Tai et al. | |
| 2015/0042207 A1* | 2/2015 | Hori | H03H 9/02834 |
| | | | 428/212 |
| 2015/0102707 A1* | 4/2015 | Hori | H03H 9/25 |
| | | | 310/348 |
| 2016/0133823 A1 | 5/2016 | Tai et al. | |
| 2016/0197263 A1 | 7/2016 | Hu | |
| 2017/0213955 A1 | 7/2017 | Silvano et al. | |

FOREIGN PATENT DOCUMENTS

| | | |
|---|---|---|
| JP | 2010-109909 A | 5/2010 |
| JP | 2011-015178 A | 1/2011 |
| JP | 2012-199762 A | 10/2012 |
| JP | 2014-147054 A | 8/2014 |
| JP | 2015-073082 A | 4/2015 |
| JP | 2013-513963 A | 4/2023 |
| KR | 20110073247 A * | 6/2011 ....... H01L 21/76256 |
| WO | 2010/109909 A1 | 9/2010 |
| WO | 2012/086639 A1 | 6/2012 |
| WO | 2014/010696 A1 | 1/2014 |
| WO | 2014/129432 A1 | 8/2014 |
| WO | 2015/012005 A1 | 1/2015 |

OTHER PUBLICATIONS

Chinese 2nd Notification of Office Action for Chinese Application No. 201680067866.1, dated Apr. 12, 2021, 6 pages.
Japanese Decision of Refusal for Japanese Application No. 2021-191041, dated Feb. 27, 2024, 2 pages with English translation.
Japanese Notice of Reasons for Refusal for Application No. 2023-213109 dated Nov. 18, 2024, 4 pages.
Korean Request for the Submission of an Opinion received for Korean Patent Application No. 10-2018-7013180, dated Sep. 8, 2023, 11 pages With English Translations.
Korean Written Decision on Registration received for Korean Patent Application No. 10-2018-7013180, dated Jan. 15, 2024, 4 pages With English Translations.
Chinese First Notification of Office Action for Application No. 201680067866.1 dated Feb. 3, 2021, 12 pages.
Hashimoto et al., Recent Development of Temperature Compensated SAW Devices, Ultrasonics Symposium, 2011 IEEE International, Oct. 18, 2011, pp. 79-86.
International Search Report for International Application No. PCT/FR2016/052674 dated Jan. 30, 2017, 2 pages.
International Written Opinion for International Application No. PCT/FR2016/052674 dated Jan. 30, 2017, 5 pages.
Japanese Notice of Rejection for Japanese Application No. 2018-520188, dated Nov. 10, 2020, 14 pages with english translation.
Japanese Office Action for Application No. 2021-191041 dated Jul. 18, 2023, 2 pages.
Japanese Official Notice of Rejection for Application No. 2021-191041 dated Jan. 10, 2023, 3 pages.
Japanese Official of Notice of Rejection, Japanese Application No. 2018-520188 dated Mar. 9, 2021, 2 pages.
Korean Office Action for Application No. 10-2018-7013180 dated Aug. 11, 2023, 10 pages.
Singapore Written Opinion for Singapore Application No. 11201803333R, dated Nov. 20, 2018, 6 pages.
Yamashia K et al. Buckling behavior of piezoelectric diaphragms for . . . PZT films, 2015 IEEE International Symposium on the Applications of Ferroelectric (ISAF), International Symposium on Integrated Functionalities (ISIF), and Piezoelectric Force Microscopy Workshop (PFM), May 2015 (Year: 2015).

* cited by examiner

HYBRID STRUCTURE AND A METHOD FOR MANUFACTURING THE SAME

CROSS-REFERENCE TO RELATED APPLICATIONS

This application is a continuation of U.S. patent application Ser. No. 17/663,569, filed May 16, 2022, now U.S. Pat. No. 11,930,710, issued Mar. 12, 2024, which is a continuation of U.S. patent application Ser. No. 15/769,690, filed Apr. 19, 2018, now U.S. Pat. No. 11,349,065, issued May 31, 2022, which is a national phase entry under 35 U.S.C. § 371 of International Patent Application PCT/FR2016/052674, filed Oct. 17, 2016, designating the United States of America and published as International Patent Publication WO 2017/068269 A1 on Apr. 27, 2017, which claims the benefit under Article 8 of the Patent Cooperation Treaty to French Patent Application Serial No. 1559993, filed Oct. 20, 2015.

TECHNICAL FIELD

This application relates to the field of manufacturing hybrid structures, especially structures that comprise a layer of piezoelectric material.

BACKGROUND

In the field of acoustic surface wave or volume devices (respectively, "SAW" for "Surface Acoustic Wave" and "BAW" for "Bulk Acoustic Wave" in the English terminology), the hetero-structures comprising a layer of lithium tantalate ($LiTaO_3$) disposed on a silicon substrate have a growing interest: on the one hand, because they are compatible with standard microelectronics equipment and methods thanks to their silicon support substrate, that offer growth opportunities and lower costs; and, on the other hand, because they have technical advantages, such as less dependence on temperature of the frequency response of SAW devices as explained in the article by K. Hashimoto, M. Radota et al., "Recent development of temperature compensated SAW devices," IEEE Ultrason. Symp. 2011, pages 79 to 86.

For example, $LiTaO_3$/Si hetero-structures may be prepared from the assembling through bonding and by molecular bonding of two $LiTaO_3$ and Si substrates, respectively. For the manufacture of acoustic wave devices on these hetero-structures, it is advantageous to be able to apply a temperature above 200° C., or 250° C., to allow the use of materials and processes that ensure good performance of the devices.

The holding of the bonding interface between the $LiTaO_3$ layer and the Si support substrate is one of the important factors that manage the good mechanical strength of the structure in temperature, especially beyond 200° C.

It, therefore, appears important to reinforce the energy of the interface of the hetero-structure prior to the manufacturing steps of the acoustic wave device. In the case of a hetero-structure manufactured by bonding a layer onto a support substrate by molecular adhesion, the bonding interface may, in particular, be reinforced by applying a heat treatment in a temperature range around 200° C. to 300° C. There is, therefore, the issue of applying such heat treatment to the hetero-structure without damaging it because of the significant difference in coefficient of thermal expansion (CTE for "Coefficient of Thermal Expansion" according to the English terminology) of both materials.

On the other hand, when a hetero-structure with a very thin layer of $LiTaO_3$ is required (for example, for the manufacture of volume acoustic wave devices), one solution is to transfer the layer using the SMART CUT® method, including a fragile plane buried in a $LiTaO_3$ donor substrate by introducing light atomic species such as hydrogen or helium, direct bonding (by molecular adhesion) of this donor substrate onto a silicon support substrate, and detachment at the level of the fragile plane buried so as to transfer a superficial layer of $LiTaO_3$ on Si. It is known that the surface layer after transfer still has defects and light atomic species in its thickness. It is, therefore, advantageous to cure this layer by performing an annealing in a suitable temperature range to allow curing of defects and the evacuation of the light atomic species, but without damaging the qualities of the thin layer transferred or the mechanical strength of the hetero-structure. For example, for a layer of $LiTaO_3$, the suitable temperature range is between 400° C. and 600° C.

The issue again is that the $LiTaO_3$/Si hetero-structures, given the very large difference in coefficient of thermal expansion between the two materials, hardly support these high thermal budgets.

During the manufacture of hybrid structures or hetero-structures, it is customary to carry out heat treatments having a high temperature when the surface layer disposed on the support substrate is as thin as possible, so as to limit stresses and deformations (as can be noticed in a curvature of the substrate) in the hybrid structure. For instance, one can mention hybrid structures of silicon type on solid silica or silicon on sapphire, which can withstand annealing to around 850° C. when the thickness of the silicon surface layer is less than about 100 nm, and the thickness of the massive silica substrate is about 700 microns, without suffering prohibitive damage. For higher thicknesses of the surface layer, typically 1 micron, the maximum applicable temperature without damage decreases, for example, to around 600° C. For even much higher thicknesses of the upper layer, for example, 700 microns, the maximum applicable temperature without damage decreases, for example, around 100° C.-150° C.

For a hybrid structure composed of a layer of $LiTaO_3$ (for example, 10 microns thick) disposed on a silicon substrate (for example, 150 mm in diameter and 625 microns thick), the Applicant used this knowledge of state of the art: it applied the annealing temperature required to reinforce the bonding interface (i.e., 250° C.) to the final hybrid structure (10 microns $LiTaO_3$ over 625 microns Si), that is, with the finest possible surface layer. The Applicant then observed unexpected results: a significant degradation of the layer by a so-called "buckling" phenomenon corresponding to the local buckling deformation of the $LiTaO_3$ layer, rendering the hybrid structure unusable.

BRIEF SUMMARY

One of the aims of the disclosure is therefore to propose a method of manufacturing a hybrid structure and provide a solution to the disadvantages of the former art. An aim of the disclosure is notably to provide a method for applying a required heat treatment without damaging the hybrid structure.

The disclosure describes a method of manufacturing a hybrid structure comprising an effective layer of piezoelectric material that has an effective thickness disposed on a support substrate with a support thickness and a coefficient of thermal expansion less than that of the effective layer, the method comprising:

a) a step of providing a bonded structure comprising a donor substrate of piezoelectric material and the support substrate, the bonded structure having a bonding interface between these two substrates;
b) a first step of thinning the donor substrate to form a thinner layer, having an intermediate thickness, disposed on the support substrate; the assembly forming a thinned structure;
c) a heat treatment step of the thinned structure at an annealing temperature;
d) a second thinning step, after step c), of the thinned layer to form the effective layer;
the method being remarkable in that it comprises, prior to step b), a step a') of determining a range of intermediate thicknesses avoiding degradation of the thinned structure (6') during the step c), the range being defined by a threshold thickness and a maximum thickness, and the intermediate thickness of the thinned layer being chosen in this range.

The manufacturing method according to the disclosure thus makes it possible to apply a heat treatment to an annealing temperature required to consolidate the bonding interface or to cure all or part of defects present in the thinned layer (which will become the effective layer), to a thinned structure for which the range of compatible thicknesses of the thinned layer has been previously determined. The heat treatment is generally not applicable to the final hybrid structure, that is, with the effective layer to its effective thickness, without generating damage to the effective layer, especially when unglued areas (bonding defects or pre-existing engraved patterns on the assembled faces of the substrates) are found at the bonding interface according to advantageous features of the disclosure, taken alone or in combination:

the threshold thickness is determined from a first sensitivity model whose input parameters include the support thickness, the thermal expansion coefficients of the donor substrate and of the support substrate, the annealing temperature and a maximum size of unglued areas found at the bonding interface of the bonded structure;
the maximum thickness is determined from a second sensitivity model whose input parameters include the support thickness (of the support substrate 1), the thermal expansion coefficients of the donor substrate 2 and the support substrate 1 and the required annealing temperature in step c) heat treatment;
the manufacturing process comprises, after step a') and prior to step b), a step a'') of recycling the bonded structure, when the determining step a') establishes the upper threshold thickness at maximum thickness or maximum thickness lower than the effective thickness;
recycling step a'') comprises a separation at the bonding interface of the bonded structure;
recycling step a'') comprises the reuse of the donor and support substrates resulting from the separation for a new step a) of providing a bonded structure;
the second thinning step d) may further comprise a step of thinning the support substrate;
the effective layer is composed of a material chosen from: lithium tantalate ($LiTaO_3$), lithium niobate ($LiNbO_3$), aluminum nitride (AlN), zinc oxide (ZnO);
the support substrate is composed of a material chosen from the group: silicon, III-V semiconductors, silicon carbide, glass, sapphire; and
the support substrate comprises one or more surface layers.

The disclosure furthermore relates to a hybrid structure comprising an effective layer of piezoelectric material with an effective thickness of less than 50 microns assembled to a support substrate having a coefficient of thermal expansion less than that of the effective layer, the hybrid structure being characterized in that a bonding interface between the effective layer and the support substrate has a bonding energy greater than 1000 $mJ/m^2$ and at least one non-bonded zone whose size is between 1 and 1000 microns.

BRIEF DESCRIPTION OF THE DRAWINGS

Other characteristics and advantages of the disclosure will emerge from the detailed description that follows with reference to the accompanying drawings in which.

DETAILED DESCRIPTION

Figure 1A:
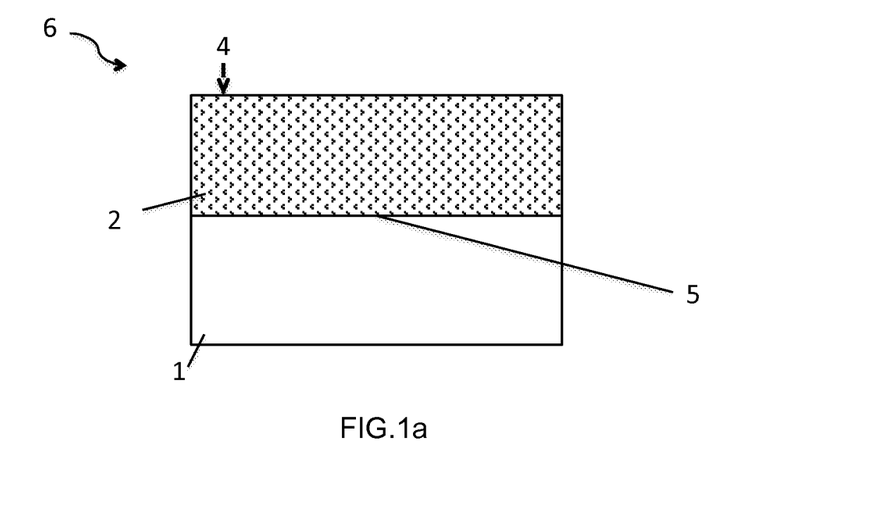
FIGS. 1a to 1c show a method of manufacturing a hybrid structure according to the disclosure.
Figure 1B:
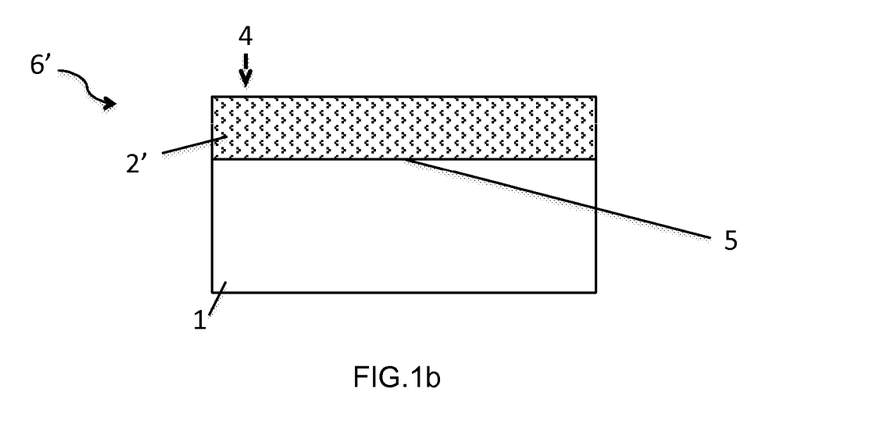
Figure 1C:
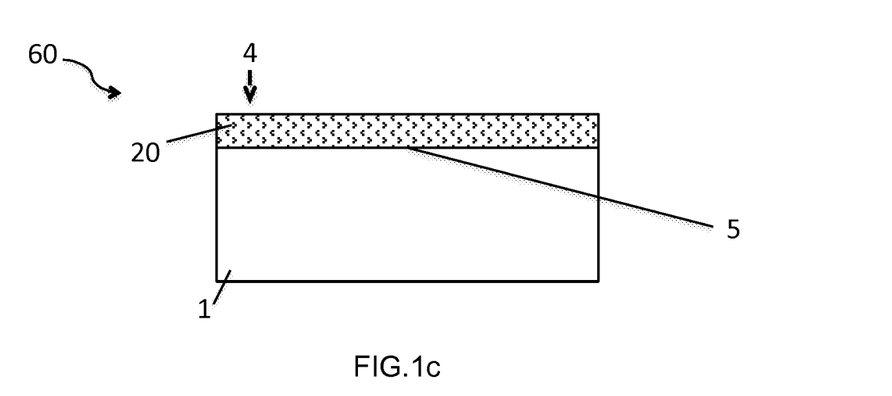

The disclosure describes a method for manufacturing a hybrid structure 60 comprising an effective layer 20 of piezoelectric material disposed on a support substrate 1 having a support thickness and a coefficient of thermal expansion less than that of the effective layer 20 (FIG. 1c).

The method comprises a step a) of providing a bonded structure 6 comprising a donor substrate 2 of piezoelectric material and the support substrate 1. Bonded structure 6 has a bonding interface 5 between these two substrates 1, 2 (FIG. 1a). For example, the donor substrate 2 may be composed of a material chosen from the group: lithium tantalate ($LiTaO_3$), lithium niobate ($LiNbO_3$), aluminum nitride (ALN), zinc oxide (ZnO). The support substrate may be composed of a material selected from the group: silicon, III-V semiconductors, silicon carbide, glass, sapphire. One and/or the other of the substrates 1, 2 may optionally comprise components (all or part of microelectronic circuits) or etched patterns on their face to be assembled: the components may be formed of stacked layers of different natures and having patterns; the etched patterns may be formed by cavities intended to ensure a function in the final device produced on the hybrid structure 60. The assembly of the bonded structure 6 is advantageously made by molecular bonding between the donor substrate 2 and the support substrate 1. Optionally, an intermediate layer, such as a layer of silicon oxide, silicon nitride or other layer that enhances adhesion molecular bonding, may be added to one or both substrates before assembly. Advantageously, the substrates 1, 2 are also subjected to cleaning and/or front surface activation before assembly, to enhance the quality and energy of the bonding interface 5 formed after assembly.

The term "unglued zone" is henceforth called a localized zone at the bonding interface, at which the surfaces of the two substrates are not intimately in contact, with the exception of the unbonded peripheral crown at the edges of the assembled substrates that form an exclusion zone. An "unbonded area" is typically surrounded by a glued area. An unglued zone may be linked to a bonding defect, for example, due to the presence of a particle or other contamination (hydrocarbon or other) at the bonding interface 5 of the bonded structure 6. It may also be related to the presence of an etched pattern or local topography on the donor substrate 2 or the support substrate 1, due to the presence of components or cavities or laser marks (for example, to ensure the traceability of the substrates) on their respective faces to be assembled.

After the assembly step, the method comprises a step b) corresponding to a first step of thinning the donor substrate 2 to form a thin layer 2', with an intermediate thickness, disposed on the support substrate 1; the whole forming a thinned structure 6' (FIG. 1b). The donor substrate 2 is thinned at its rear face 4, by techniques of mechanical thinning, mechanical-chemical and/or chemical etching or by a SMART CUT® type process, well known to those skilled in the art. For instance, the donor substrate 2 can be thinned by "grinding" (mechanical thinning) and then by chemical-mechanical polishing. This thinning step precedes a heat treatment step c) the function of which may be to consolidate the bonding interface 5 or to cure defects in the thinned layer 2' which becomes the effective layer 20. It is thus important that the step b) thinning leads to obtaining a thinned structure 6' that is compatible with the heat treatment required in the following step c).

As such, the manufacturing method is remarkable in that it comprises a step a'), prior to step b) of thinning, of determining a range of intermediate thicknesses for the thinned layer 2', meant to avoid degradation of the thinned structure during step c) heat treatment. The range is defined by a threshold thickness and a maximum thickness, the intermediate thickness of the thinned layer 2' is thus chosen in this range.

The threshold thickness is determined from a first sensitivity model whose input parameters include the support thickness (of the support substrate 1), the thermal expansion coefficients of the donor substrate 2 and the support substrate 1, the temperature of annealing required in step c) heat treatment and a maximum size of unbonded areas found at the bonding interface 5 of the bonded structure 6.

The first sensitivity model is established from an equation reflecting the relaxation of a thin layer in compression on a substrate. A phenomenon of relaxation of a thin layer such as "buckling" requires the presence of an unglued zone at the interface between the thin layer and the substrate. The $\sigma_{buckling}$ critical stress necessary to initiate the relaxing of the thin layer, which corresponds to the local buckling deformation of the layer, can be expressed as:

$$\sigma_{buckling} = \frac{\pi^2}{12} \frac{E_2}{(1-v_2^2)} \left(\frac{h_2}{r}\right)^2 \quad \{eq. 1\}$$

with $E_2$ the Young's modulus of the thin layer, $v_2$ the Poisson's ratio of the thin layer, $h_2$ the thickness of the thin layer and r the radius of the unbonded zone between the thin layer and the substrate. The stress translates a force applied per unit area over the section (length×thickness) of the thin layer. To overcome the length of the section and to consider only the thickness $h_2$ of the thin layer, it is possible to express a critical force normalized by the length, $F_{buckling}^{norm.}$ in N/m:

$$F_{buckling}^{norm} = \sigma_{buckling} \cdot h_2 = \frac{\pi^2}{12} \frac{E_2 \cdot h_2}{(1-v_2^2)} \left(\frac{h_2}{r}\right)^2 \quad \{eq. 2\}$$

Consider that the thin layer corresponds to the thinned layer 2': $E_2$, $v_2$ are, therefore, the Young's modulus and the Poisson's ratio, respectively, of the piezoelectric material that constitute the thinned layer 2'; $h_2$ is the intermediate thickness and r is the maximum radius of the non-bonded areas present at the bonding interface 5 of the bonded structure 6. The size of unbonded areas found at the bonding interface 5 may, for example, be determined by imaging in white light or infrared according to the materials that are part of the bonded structure 6, or by acoustic microscopy, an especially advantageous technique for detecting unglued areas of small size. The maximum radius of the areas not bonded to the bonding interface 5 (which may be related to bonding defects or to pre-existing patterns on one or the other of the assembled faces of the donor and support substrates 1, 2 may thus be taken out for each bonded structure 6.

The equation {eq. 2} indicates that the "buckling" phenomenon will be all the easier to initiate (i.e., it will require a lower normalized force $F_{buckling}^{norm.}$) than the intermediate thickness $h_2$ of the thinned layer 2' will be weak and that the maximum radius r unglued areas will be large.

The support thickness $h_1$ of the support substrate 1 and its mechanical characteristics ($E_1$, its Young's modulus) are also known; the required annealing temperature to be applied to the thinned structure 6' during the heat treatment of step c) is also known. It is, therefore, possible to express the force in normalized compression $F^{norm.}$ that will apply to the thinned layer 2' during the heat treatment of step c):

$$F^{norm.} = \frac{(E_1 \cdot h_1^3 + E_2 \cdot h_2^3)}{6(h_1 + h_2) \cdot \rho} \quad \{eq. 3\}$$

with $\rho$ the radius of curvature of the thinned structure 6':

$$\frac{1}{\rho} = \frac{\Delta CTE.\Delta T}{K(h1mh2)} \quad \{eq. 4\}$$

with $\Delta CTE$, the difference between thermal expansion coefficients of the respective materials of the thinned layer 2' and the support substrate 1; $\Delta T$ delta temperature between room temperature and annealing temperature applied; and the term $K (h_1, h_2)$ which is expressed as:

$$K(h_1, h_2) = \frac{h_1 + h_2}{2} + \frac{(E_1 \cdot h_1^3 + E_2 \cdot h_2^3)}{6(h_1 + h_2)} \cdot \left(\frac{1}{E_1 \cdot h_1} + \frac{1}{E_2 \cdot h_2}\right) \quad \{eq. 5\}$$

The threshold thickness of the range can thus be determined by solving the equation {eq. 5} $F^{norm.} = F_{buckling}^{norm.}$, $$\frac{(E_1 \cdot h_1^3 + E_2 \cdot h_{2thrsd}^3) \cdot \Delta CTE.\Delta T}{6(h_1 + h_{2thrsd}).K(h_1, h_{2thrsd})} = \frac{\pi^2}{12} \frac{E_2 \cdot h_{2thrsd}}{(1-v_2^2)} \left(\frac{h_{2thrsd}}{r}\right)^2 \quad \{eq. 6\}$$

with $h_{2thrsd}$ the threshold thickness.

The threshold thickness corresponds to the intermediate thickness below which the "buckling" phenomenon has a high probability of appearing, taking into account the characteristics of the thinned structure 6' (type of materials that constitute it, maximum size of unglued zones found at the bonding interface 5, thickness of the support substrate) and the annealing temperature to be applied during step c) heat treatment. Note that the "buckling" phenomenon can also be accompanied by an enlargement of the unbonded zone, preferably perpendicular to the crystallographic axes having the highest coefficient of expansion. This enlargement can all the more be as significant as the energy of the bonding interface 5 is low. Consolidating the energy of the bonding interface 5, in a configuration to avoid the appearance of "buckling" is, therefore, of utmost importance.

The first sensitivity model thus connects the threshold thickness to a set of characteristic parameters of the thinned structure 6' and to the thermal stress it must undergo.

The maximum thickness is determined from a second sensitivity model whose input parameters include the support thickness (of the support substrate 1), the thermal expansion coefficients of the donor substrate 2 and the support substrate 1 and the required annealing temperature in step c) heat treatment.

The second sensitivity model is established from an equation reflecting the rupture of the material that constitutes support substrate 1, constrained in extension in the thinned structure 6' during a heat treatment. Elastic energy E stored in the support substrate 1, in the case of a thinned structure 6' comprising a thinned layer 2' and a support substrate 1 of different nature and to which a heat treatment is applied, is expressed as follows:

$$E = \frac{1}{E_1}\left(\frac{(F^{norm.})^2}{h_1}\right) + \frac{E_2^2 \cdot h_1^3}{12 \cdot \rho^2} \quad \{eq. 7\}$$

Rupture of the material that constitutes support substrate 1 appears when elastic energy E exceeds a critical value given by:

$$E_{rupture} = \frac{K_{1C}^2}{E_1} \quad \{eq. 8\}$$

with $K_{1c}$ the tenacity of the material that constitutes support substrate 1.

The maximum thickness of the range can thus be determined $E=E_{rupture}$, by solving the equation:

$$\left(\frac{1}{h_1}\left[\frac{(E_1 \cdot h_1^3 + E_2 \cdot h_{2ceiling}^3) \cdot \Delta CTE \cdot \Delta T}{6(h_1 + h_{2ceiling}) \cdot K(h_1, h_{2ceiling})}\right]^2 + \frac{E_1^2 \cdot h_1^3(\Delta CTE. \Delta T)^2}{12 \cdot [K(h_1, h_{2ceiling})]^2}\right) = K_{1c}^2 \quad \{eq. 9\}$$

with $h_{2ceiling}$ the maximum thickness.

The maximum thickness corresponds to the intermediate thickness of the thinned layer 2' above which the rupture of support substrate 1 has a high probability of appearing, taking into account the characteristics of the thinned structure 6' (type of material constituting it, thickness of the support substrate 1) and the annealing temperature to be applied during the thermal treatment of step c).

The second sensitivity model thus connects the maximum thickness to a set of characteristic parameters of the thinned structure 6' and to the heat stress it must undergo.

A heterogeneous structure such as thinned structure 6' undergoes stress and deformations when subjected to a heat treatment, due to the differential expansions of the two materials that constitute it. It deforms by adopting a curvature that can lead to different failure modes: the breaking of the support substrate 1, the buckling of the thinned layer 2', the formation of dislocations or sliding planes in the structure (especially in thinned layer 2'), the lift-off at the edges of thinned structure 6', etc. Experimentally, the Applicant realized that, in the case of thinned structures 6' comprising a layer of piezoelectric material and a support substrate of a material with a lower coefficient of thermal expansion, the two predominant failure modes were on the one hand the breakage of the support substrate 1 (rupture phenomenon of the material beyond the critical rupture energy) and secondly, the local buckling at the level of non-bonded areas of the thinned layer 2' (phenomenon of relaxation of a thin layer in compression, called "buckling"). The two sensitivity models established by the Applicant from equations {eq. 6} and {eq. 9} are, therefore, well suited to determining thickness ranges for the thinned layer 2', in the case of heterogeneous thinned structures 6', the thinned layer 2' of which is made up of a piezoelectric material.

Figure 2A:
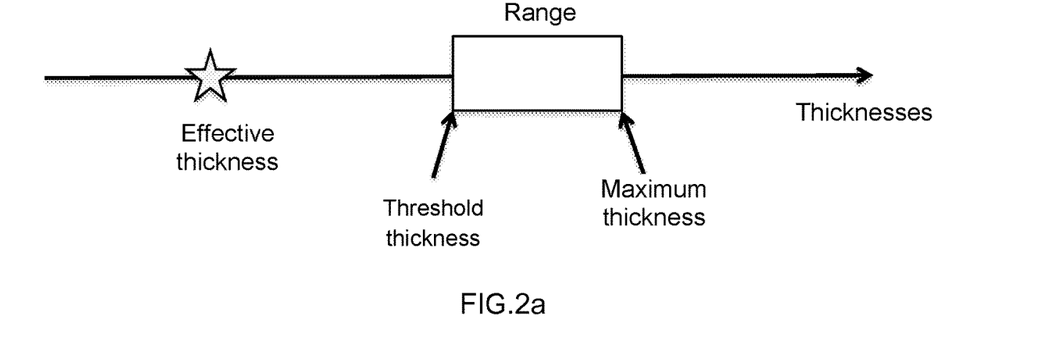
FIGS. 2a to 2c show three different configurations of thickness ranges, versus the effective thickness, resulting from a determination step according to the disclosure.
Figure 2B:
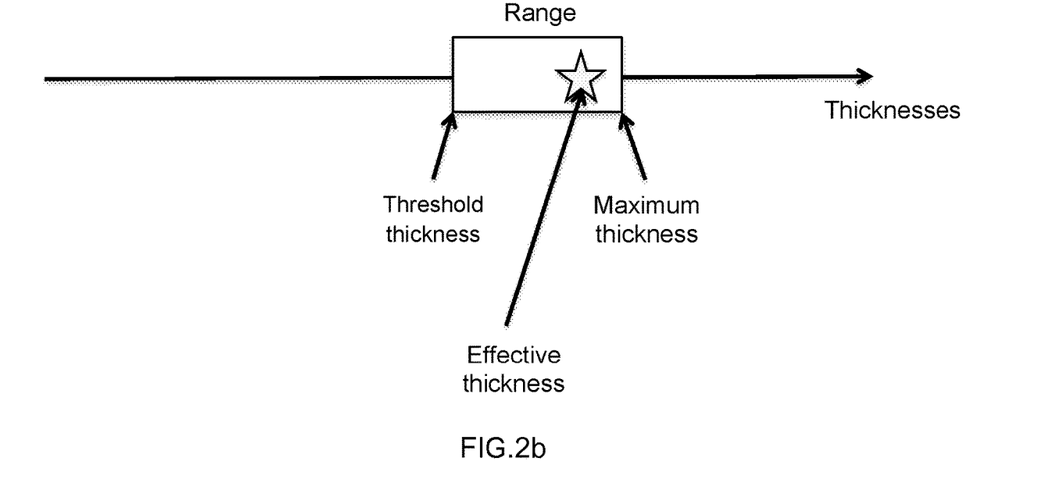
Figure 2C:
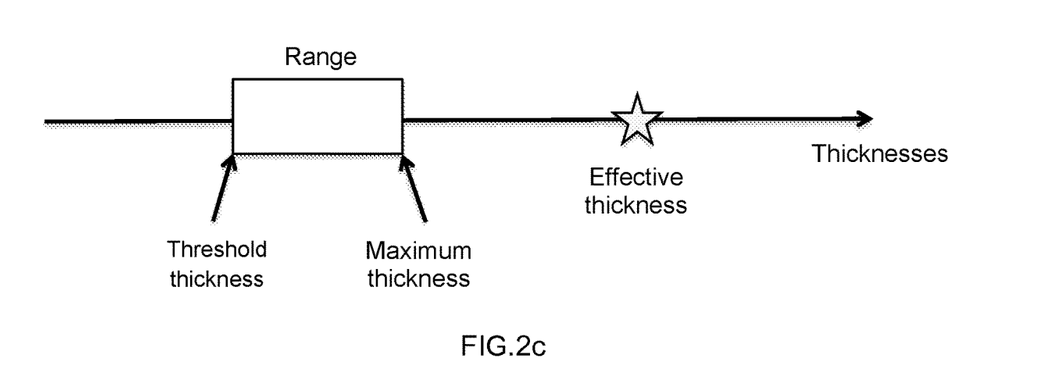

Following step a'), a thickness range defined by the determined threshold thickness and maximum thickness is thus obtained, as illustrated in FIGS. 2a to 2c.

According to a first variant of implementing the manufacturing method, the effective thickness of the expected effective layer 20 for the final hybrid structure 60 is less than the defined thickness range (FIG. 2a): this is a case of thicknesses ranges that are compatible with the envisaged final structure. The manufacturing method according to the disclosure comprises, as mentioned above, step b) of thinning of the donor substrate 2 to form the thinned layer 2', after step a') to determine the thickness range with which it is compatible. The intermediate thickness of thinned layer 2' is then chosen to be in the range, i.e., between the threshold thickness and the maximum thickness. The process then comprises step c) of heat treatment at the annealing temperature required for the thinned structure 6'. For instance, the annealing temperature may vary between 200° C. and 600° C. depending on the type of hybrid structure expected and according to the aim of the heat treatment: consolidating bonding interface 5, cure of defects or diffusion of light species in the thickness of thinned layer 2' (intended to become the effective layer 20), etc. Heat treatment may comprise an inlet and an outlet of the oven at a low temperature, for example, 100° C., a rise and fall ramp in temperature, for example, between 0.5°/minute and 5°/minute, and a bearing at the required annealing temperature, for example, between 200° C. and 600° C., for a period ranging from 30 minutes to a few hours.

After step c) of heat treatment, the method comprises a step d) corresponding to a second step of thinning the thinned layer 2' to form the effective layer 20 that has an effective thickness, disposed on support substrate 1; the whole forming the final hybrid structure 60 (FIG. 1c). Layer 2' is thus thinned again, at its rear face 4, by techniques of mechanical thinning, mechanical-chemical and/or chemical etching and/or thinning by the SMART CUT® method. For instance, layer 2' can be thinned by mechanical-chemical polishing sequences, followed by cleaning. The hybrid structure 60 thus formed can then be used for the production of electronic devices, its properties (bonding energy of bonding interface 5 and/or quality of effective layer 20) having been improved by the realization of the method according to the disclosure. Usually, the development steps of devices do not require heat treatments to be applied at a temperature as high as the annealing temperature of step c) of the method.

According to a second implementation variant of the manufacturing method, the effective thickness of the expected effective layer 20 for final hybrid structure 60 is within the defined thickness range (FIG. 2b); this is in a case of thickness range compatible with the envisaged final structure. The manufacturing method according to the disclosure comprises, as mentioned above, step b) of thinning the donor substrate 2 to form the thinned layer 2', after step a'). The intermediate thickness of the thinned layer 2' is advantageously chosen to be in the range, and especially, it is chosen to be equal to or substantially greater than the effective thickness. The process then comprises step c) of heat treatment at the annealing temperature required for the thinned structure 6'. For instance, the annealing temperature may vary between 200° C. and 600° C. depending on the type of hybrid structure 60 expected and according to the objective of the heat treatment.

After heat treatment in step c), the method comprises a step d) corresponding to a second step of thinning the thinned layer 2' to form the effective layer 20 with an effective thickness, disposed on support substrate 1; the whole forming the final hybrid structure 60. According to this second implementation variant, step b) of thinning the thinned layer already brings the intermediate thickness substantially to the effective thickness. Step d) can thus consist essentially of a polishing step with a low removal ("touch polishing" according to the English terminology) and cleaning sequences, to improve the surface condition of the face 4 of the effective layer 20. The hybrid structure 60 thus formed can then be used for the development of electronic devices, especially acoustic wave devices.

According to a third variant of implementing the manufacturing method according to the disclosure, the effective thickness of the effective layer 20 expected for the final hybrid structure 60 is greater than the defined thickness range (FIG. 2c); in other words, the effective thickness is greater than the maximum thickness. This configuration reflects the fact that the defined thickness range (determined by the sensitivity models and from the characteristics of the bonded structure 6 and the required annealing temperature) is incompatible with the expected final hybrid structure 60.

This thickness range configuration that is incompatible with the expected hybrid structure (FIG. 2c) can be as a result of the inadequacy of the support thickness. The manufacturing method, according to the disclosure, then comprises a step a") of recycling the bonded structure 6. Step a") consists of achieving the lift-off of the bonded structure 6 at the bonding interface 5, leading to the separation of the donor substrate 2 and the support substrate 1. The separation can be performed by inserting a bevel-shaped tool between the chamfered edges of the two donor and support substrates 2, 1 of the bonded structure 6. After the separation, the recycling step a") further comprises the reuse of the detached donor and support substrates 2, 1 for a new step a) to provide a bonded structure 6. One can take advantage of the recycling step a") to use a support substrate 1 of greater thickness and provide a new bonded structure 6. The increase in the support thickness notably increases the value of the maximum thickness, the aim of which is to find a range of compatible thicknesses; i.e., with a maximum thickness greater than the expected effective thickness. The second thinning step d) according to the method also comprises, in this case, a thinning step of the rear face 4 of the support substrate 1, so as to bring it back to the required support thickness for the final hybrid structure 60. This additional thinning step may consist of a mechanical, mechanical-chemical or chemical thinning.

The configuration in which the thickness range is incompatible with the expected hybrid structure (FIG. 2c) may also be related to the fact that the annealing temperature is too high. One can then choose to reduce the annealing temperature to be applied in step c) of heat treatment. The recycling step a") can also be used to apply a different surface preparation (potentially more complex or expensive but necessary in this case) to the substrates 1 and 2 before their assembly, allowing, for example, promoting the bonding energy after a heat treatment at a lower temperature. A new thickness range is then determined before continuing the process.

According to a fourth implementation variant of the manufacturing method, the threshold thickness determined in step a') is greater than the maximum thickness determined at the same step (configuration not shown). In this case, the thickness range is also considered incompatible with the expected structure, since it does not exist (the thickness range being defined by a threshold thickness lower than a maximum thickness). It may be that in this case the maximum size of the unbonded areas found at the bonding interface 5 is too large to allow a compatible thickness range. The manufacturing method, according to the disclosure, then comprises a step a") of recycling the bonded structure 6. Step a") consists of achieving the lift-off of the bonded structure 6 at the bonding interface 5, leading to the separation of the donor substrate 2 and the support substrate 1. The detachment can be done by applying a stress at the interface between the two donor and support substrates 2 and 1 of the bonded structure 6. After the separation, the recycling step a") comprises the reuse of the detached donor substrates 2 and support 1 for a new step a) of providing a bonded structure 6. Assuming that the unglued zone of maximum size was relative to a bonding failure, the recycling step a") can eliminate this defect by a new cleaning and preparation of the surfaces of substrates 1, 2 to be assembled.

If the size of the unbonded areas found at the bonding interface 5 is difficult to reduce (in the case, for example, of pre-existing patterns or cavities on one of the two substrates assembled and having a particular function), step a") of recycling can be used, for example, to use and modify the assembly conditions in order to allow a reduction in subsequent temperature required to be applied in step c) and provide a new bonded structure 6.

Figure 3:
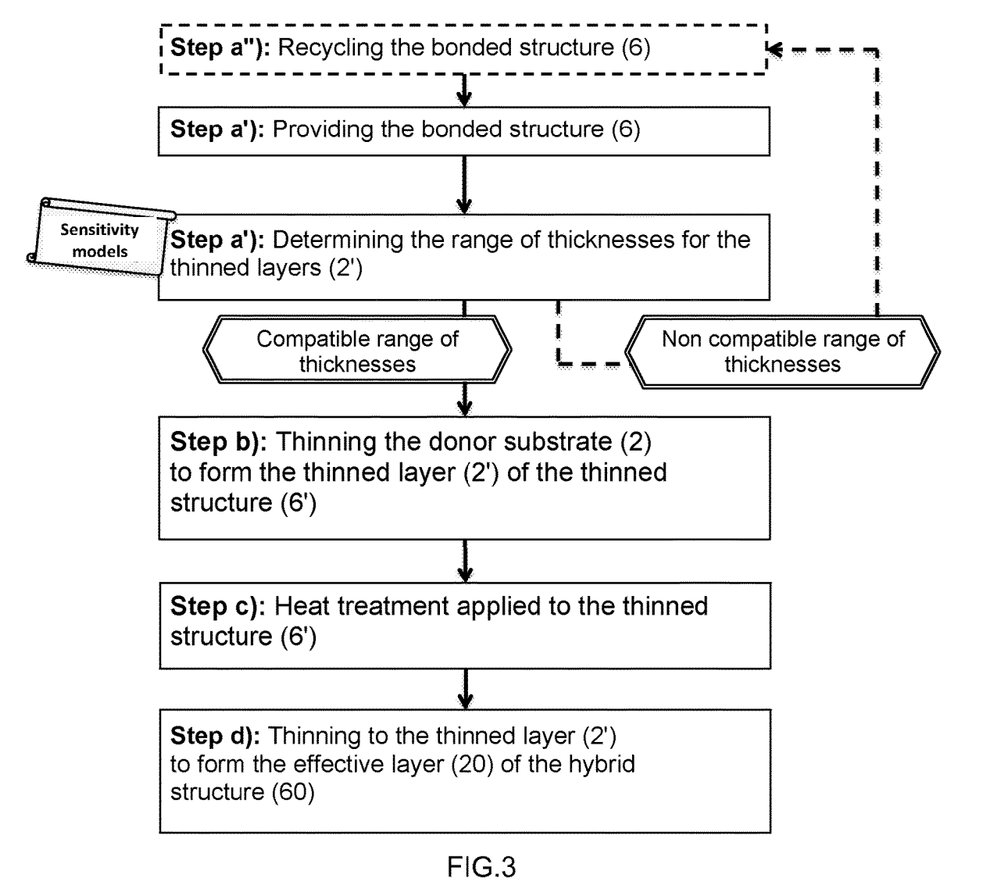
FIG. 3 shows different stages of the manufacturing process according to the disclosure.

The main steps of the method according to the disclosure are illustrated in FIG. 3.

The manufacturing method according to the disclosure makes it possible to apply a heat treatment to an annealing temperature required to consolidate the bonding interface 5 or to cure defects in the thinned layer 2' (which becomes the effective layer 20), a thinned structure 6' for which the range of compatible thicknesses for the thinned layer 2' has been previously determined. The heat treatment is generally not applicable to the final hybrid structure 60, i.e., with the effective layer 20 to its effective thickness, without generating damage to the effective layer 20, especially when unglued areas (pre-existing bonding defects or engraved patterns on the assembled faces of the substrates 1, 2) are found at the bonding interface 5.

Besides, step a') to determine the range of compatible thicknesses makes it possible to identify when it is necessary to recycle the bonded structure 6. This is before engaging the thinning step b), which allows thus to increase the manufacturing yields.

The disclosure also describes a hybrid structure 60 comprising an effective layer 20 of piezoelectric material of effective thickness less than 50 microns assembled to a support substrate 1 having a coefficient of thermal expansion less than that of the effective layer 20 (FIG. 1c). The bonding interface 5 between the effective layer 20 and the support substrate 1 has a bonding energy greater than or equal to 1000 mJ/m² and at least one non-bonded area whose size is between 1 and 1000 microns. The effective layer 20 is composed of a material chosen from the group: lithium tantalate (LiTaO₃), lithium niobate (LiNbO₃), aluminum nitride (AlN), and zinc oxide (ZnO); for example, its thickness is between 0.1 micron and 50 microns. The support substrate is made up of a material chosen from the group: silicon, III-V semiconductors, silicon carbide, glass, and sapphire; for example, its thickness is between 0.1 micron and 50 microns. The support substrate can also comprise one or more different types of surface layers. For example, the support substrate may consist of a single-crystal silicon substrate having a surface layer on the side of its face to be assembled, capable of trapping charges, in particular, polycrystalline silicon; it may also consist of an SOI substrate (silicon-on-insulator) whose surface layers are in silicon oxide and silicon or in an SOI substrate provided with a charge trapping layer under the oxide layer.

Example 1

A support substrate 1 made of silicon (Si) 150 mm in diameter, 725 microns thick, has etched patterns spaced evenly over its entire face to be assembled. These reasons may, for example, have a function of alignment marks or constitute cavities for the manufacture of suspended membranes or more still made up of electrical contacts in the final hybrid structure 60, on which the devices is developed. The support substrate 1 also comprises an oxide layer on its face to be assembled. It is glued together by molecular bonding with a donor substrate 2 made of lithium tantalate (LiTaO₃) of the same diameter to provide the bonded structure 6. A microscopy acoustic control step makes it possible to detect and measure the non-bonded areas at the bonding interface 5, generated by the patterns. The maximum size of unglued areas corresponds to a radius r of 500 microns.

The expected final hybrid structure 60 has a useful 10 micron layer and a 725 micron support substrate. The annealing temperature to be applied is 230° C. in order to sufficiently consolidate the bonding interface 5 so that the hybrid structure 60 supports the subsequent steps of developing the acoustic wave devices.

Step a') makes it possible to determine threshold and maximum thicknesses: $h_{2threshold}=28$ μm and $h_{2ceiling}=32$ μm. The thickness range obtained is compatible with the expected hybrid structure 60, the effective thickness being less than the range.

Step b) thinning, consisting of mechanical thinning followed by chemical mechanical polishing and chemical cleaning, allows the forming of a thinned layer 2' having an intermediate thickness of 30 microns. The heat treatment of step c) is then carried out. Entry into the oven is at 100° C., the ramp temperature rise is 1°/minute until it reaches a peak at 230° C., for a period of 4 hours. A temperature ramp down to 1°/minute is then operated up to 100° C. before taking out the thinned structure 6' of the oven. The thinned structure 6' then undergoes a second step of thinning the thinned layer 2' to a thickness of 10 microns to form the effective layer 20.

The hybrid structure 60 thus obtained is integral and has a consolidated bonding interface 5 whose bonding energy is greater than or equal to 1000 mJ/m², a useful integrated layer having no degradation linked to "buckling" phenomena and this despite the presence of unglued areas at its interface, a size ranging between 100 and 500 microns. Such a hybrid structure 60 can then be used for the development of acoustic wave devices.

Example 2

A support substrate 1 made of silicon (Si) having a diameter of 150 mm and a thickness of 725 microns and comprising an oxide layer on its face to be assembled is adhesively bonded to a donor substrate 2 made of lithium tantalate (LiTaO₃) of the same diameter to provide the glued structure 6. A microscopy acoustic control step makes it possible to detect two gluing defects (unglued areas) at the gluing interface 5, whose maximum size corresponds to a radius r of 700 microns.

The expected final hybrid structure 60 has a useful 10 micron layer and a 725 micron support substrate. The annealing temperature to be applied is 250° C., with the aim of sufficiently consolidating the bonding interface 5 so that the hybrid structure 60 supports the subsequent steps of developing the acoustic wave devices.

Step a') makes it possible to determine threshold and maximum thicknesses: $h_{2threshold}=28$ μm and $h_{2ceiling}=25$ μm. The thickness range obtained is not compatible with the expected hybrid structure 60, the threshold thickness being greater than the maximum thickness.

The recycling step a") is then carried out, in order to reduce the maximum size of the gluing defects present at the gluing interface 5: the insertion of a tool in the form of a bevel at the level of the bonding interface 5 of the bonded structure 6 makes it possible to separate the donor and support substrates 2, 1. A new cleaning and surface activation sequence of the two substrates is carried out before a new assembly to provide a new bonded structure 6. A new acoustic microscopy control step makes it possible to detect ten defects at the bonding interface 5, the maximum size of which corresponds to a radius r of 150 microns.

On the basis of new characteristics of bonded structure 6, step a') helps to determine the following threshold and maximum thicknesses: $h_{2threshold}=20$ μm and $h_{2ceiling}=25$ μm. The thickness range obtained is now compatible with the expected hybrid structure 60, the threshold thickness being less than the maximum thickness and the effective thickness being less than the range.

Step b) of thinning, consisting of a mechanical thinning followed by chemical mechanical polishing and chemical cleaning, allows a thinned layer 2' whose intermediate thickness is 23 microns to be formed. The heat treatment of step c) is then carried out. Entry into the oven is done at 70° C., the ramp temperature rise ramp is 1°/minute until it reaches a plateau at 250° C., for a period of 4 hours. A temperature ramp down to 1°/minute is then operated up to 100° C. before removing the structure from the oven. The thinned structure 6' then undergoes a second step of thinning the thinned layer 2' to an effective thickness of 10 microns to form the effective layer 20.

The hybrid structure 60 thus obtained is integral and has a consolidated bonding interface 5 whose bonding energy is greater than or equal to 1000 mJ/m, or even greater than 1500 mJ/m²; it also has a useful integral layer 20 with no degradation related to "buckling" phenomena, despite the presence of non-bonded areas at its interface of a size between 50 and 150 microns. Such a hybrid structure 60 can then be used for the development of acoustic wave devices.

Of course, the invention is not limited to the embodiments and examples described, and variants can be provided without departing from the scope of the invention as defined by the claims.

What is claimed is:

1. A hybrid structure, comprising:
a support substrate having a first coefficient of thermal expansion and a support thickness; and
an effective layer disposed on and molecularly bonded to the support substrate along a bonding interface having a bonding energy greater than or equal to 1000 mJ/m$^2$, the effective layer having an effective thickness, the effective layer having a second coefficient of thermal expansion greater than the first coefficient of thermal expansion of the support substrate;
wherein one or more non-bonded areas are present at the bonding interface between the effective layer and the support substrate, and the effective thickness is less than a threshold thickness at which buckling of the effective layer occurs upon annealing of the hybrid structure at a temperature of 400° C.±200° C.

2. The hybrid structure of claim 1, wherein each of the one or more non-bonded areas has a radius within a range of from 1 micron to 1000 microns.

3. The hybrid structure of claim 1, wherein the effective layer comprises a piezoelectric material.

4. The hybrid structure of claim 1, wherein the effective thickness is within a range of from 0.1 micron to 50 microns.

5. The hybrid structure of claim 1, wherein the effective layer comprises at least one material selected from among a group consisting of: lithium tantalate (LiTaO$_3$), lithium niobate (LiNbO$_3$), aluminum nitride (AlN), and zinc oxide (ZnO).

6. The hybrid structure of claim 1, wherein the bonding energy of the bonding interface is greater than 1500 mJ/m$^2$.

7. The hybrid structure of claim 1, wherein the support substrate comprises at least one material selected from among a group consisting of: silicon, a Group III-V semiconductor material, silicon carbide, glass, and sapphire.

8. The hybrid structure of claim 1, wherein the support substrate comprises one or more surface layers.

9. The hybrid structure of claim 8, wherein the one or more surface layers comprises a charge-trapping layer.

10. The hybrid structure of claim 9, wherein the charge-trapping layer comprises polycrystalline silicon.

11. The hybrid structure of claim 8, wherein the one or more surface layers comprises an oxide layer.

12. The hybrid structure of claim 11, wherein the oxide layer comprises silicon oxide.

13. The hybrid structure of claim 8, wherein the one or more surface layers comprise a charge-trapping layer under an oxide layer.

14. The hybrid structure of claim 13, wherein the charge-trapping layer comprises polycrystalline silicon, and the oxide layer comprises silicon oxide.

15. An acoustic wave device comprising the hybrid structure according to claim 1.

* * * * *